United States Patent [19]
Kohyama

[11] Patent Number: 5,521,418
[45] Date of Patent: May 28, 1996

[54] SEMICONDUCTOR DEVICE AND A METHOD OF MANUFACTURING SAME

[75] Inventor: Yusuke Kohyama, Kawasaki, Japan

[73] Assignee: Kabushiki Kaisha Toshiba, Kawasaki, Japan

[21] Appl. No.: 518,922

[22] Filed: Jul. 5, 1995

Related U.S. Application Data

[63] Continuation of Ser. No. 878,921, May 6, 1992, abandoned, which is a continuation-in-part of Ser. No. 730,695, Jul. 16, 1991, abandoned.

[30] Foreign Application Priority Data

Jul. 17, 1990 [JP] Japan .................................. 2-187250

[51] Int. Cl.⁶ .......................... H01L 27/12; H01L 21/02
[52] U.S. Cl. .................. 257/390; 257/629; 257/640; 257/646; 257/647; 257/649; 437/235; 437/241; 437/245; 437/187; 437/203; 437/913
[58] Field of Search ..................... 257/629, 649, 257/640, 646, 390; 437/235, 187, 203, 241, 245, 913

[56] References Cited

U.S. PATENT DOCUMENTS

| | | | |
|---|---|---|---|
| 4,816,882 | 3/1989 | Blanchard | 357/23.4 |
| 5,017,982 | 5/1991 | Kobayashi | 257/640 |

FOREIGN PATENT DOCUMENTS

| | | |
|---|---|---|
| 62-055949 | 3/1987 | Japan . |
| 62-216343 | 9/1987 | Japan . |
| 2-046731 | 2/1990 | Japan . |

*Primary Examiner*—Edward Wojciechowicz
*Attorney, Agent, or Firm*—Banner & Allegretti, Ltd.

[57] ABSTRACT

This invention discloses a semiconductor device comprising a semiconductor substrate, a first conducting layer formed on the surface of the semiconductor substrate, an insulating layer formed above the semiconductor substrate, the insulating layer having a contact hole reaching the first conducting layer to expose it, a second conducting layer formed on the insulating layer, the sidewall of the contact hole, and the first conducting layer, and an anti-oxidation layer formed on at least part of the surface of the second conducting layer.

14 Claims, 10 Drawing Sheets

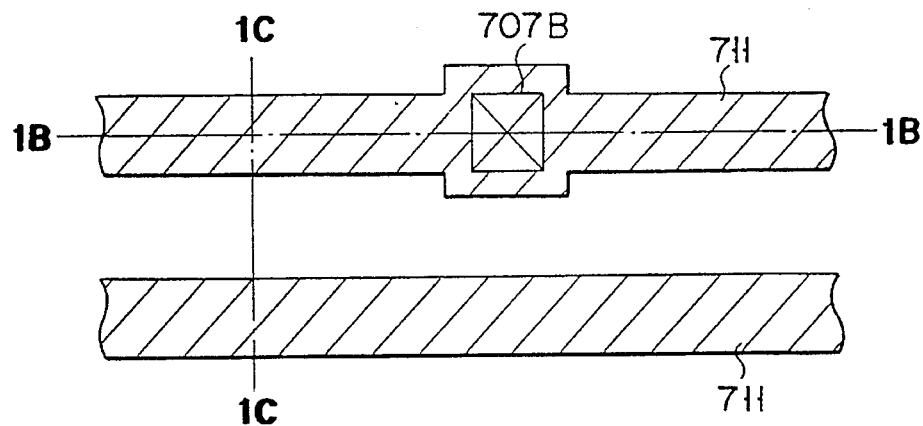
F I G. 1A
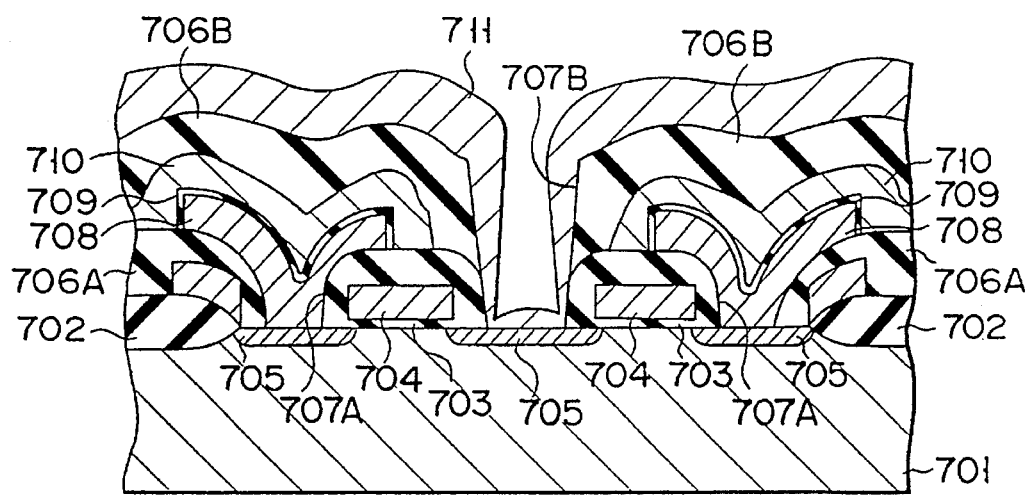
F I G. 1B
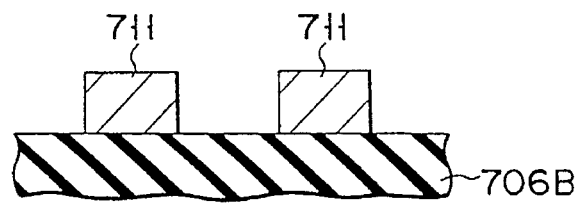
F I G. 1C

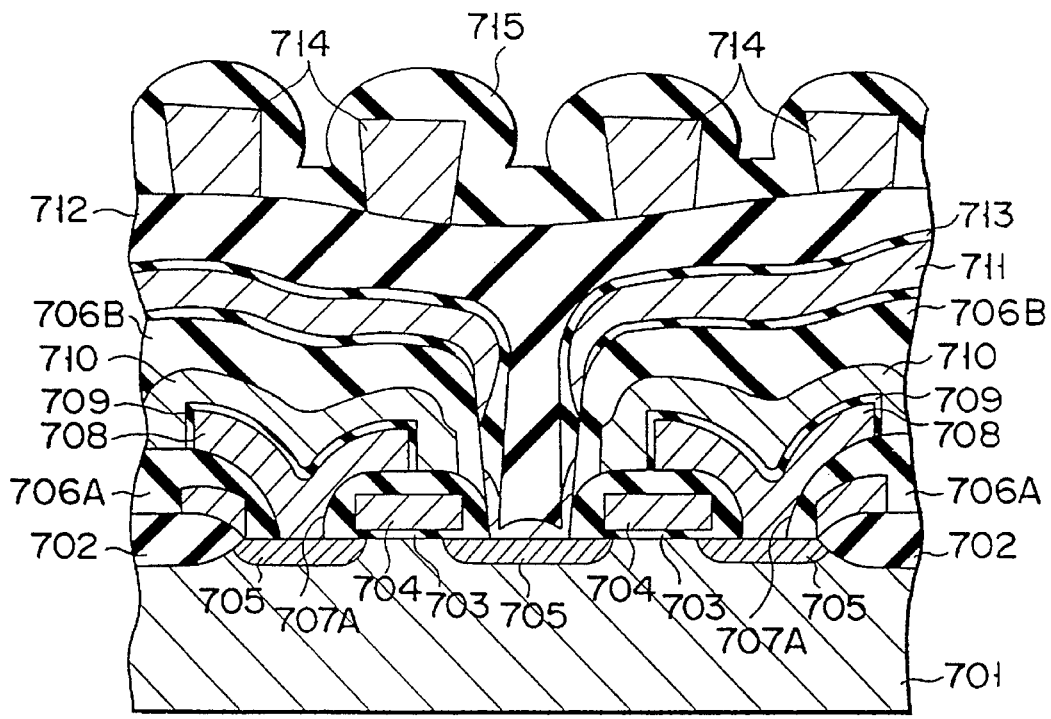
F I G. 3A
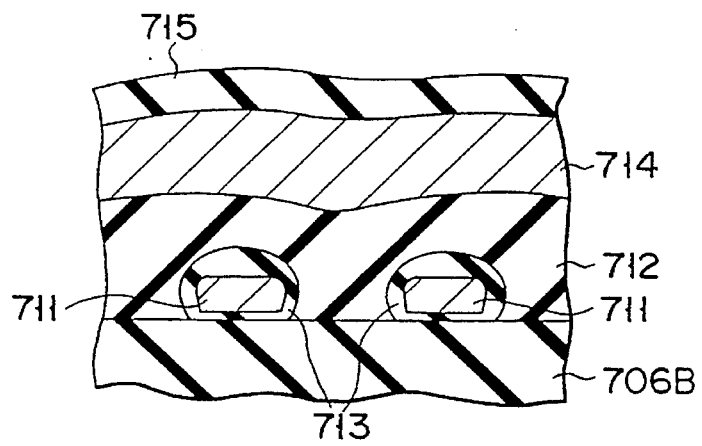
F I G. 3B

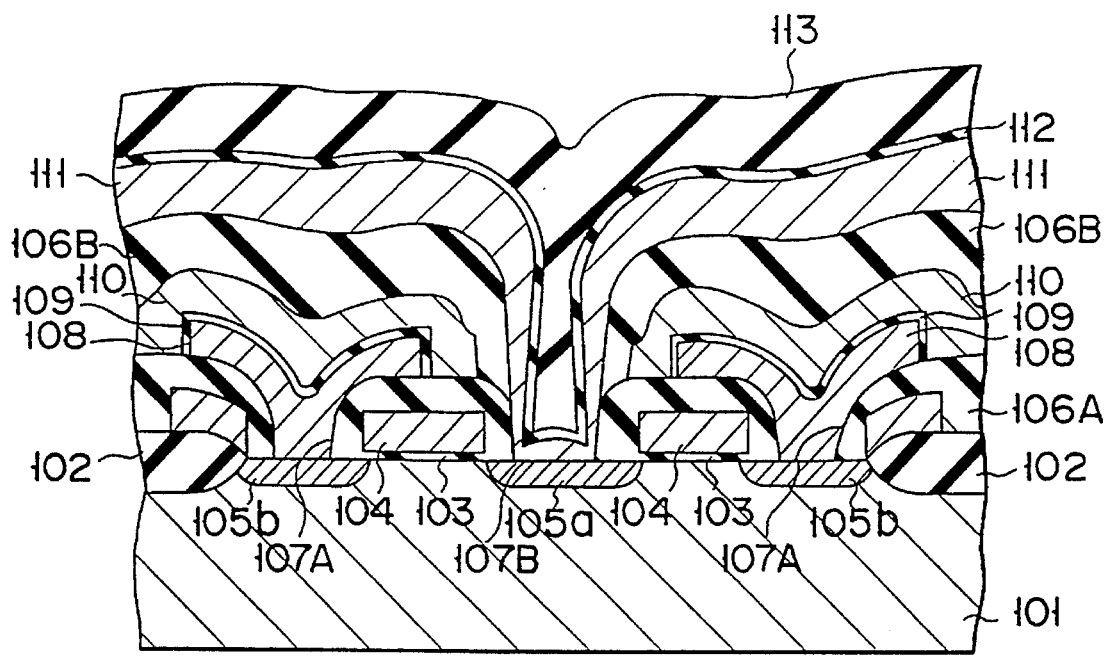
F I G. 6A
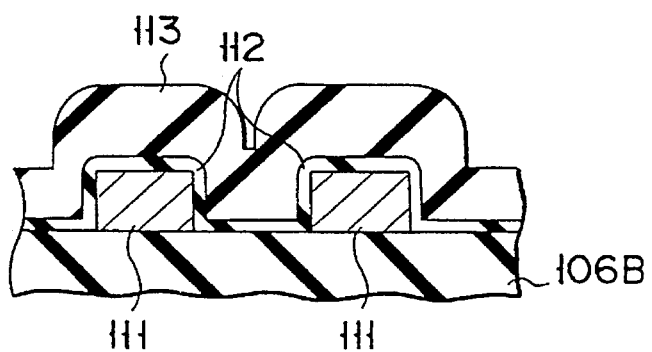
F I G. 6B

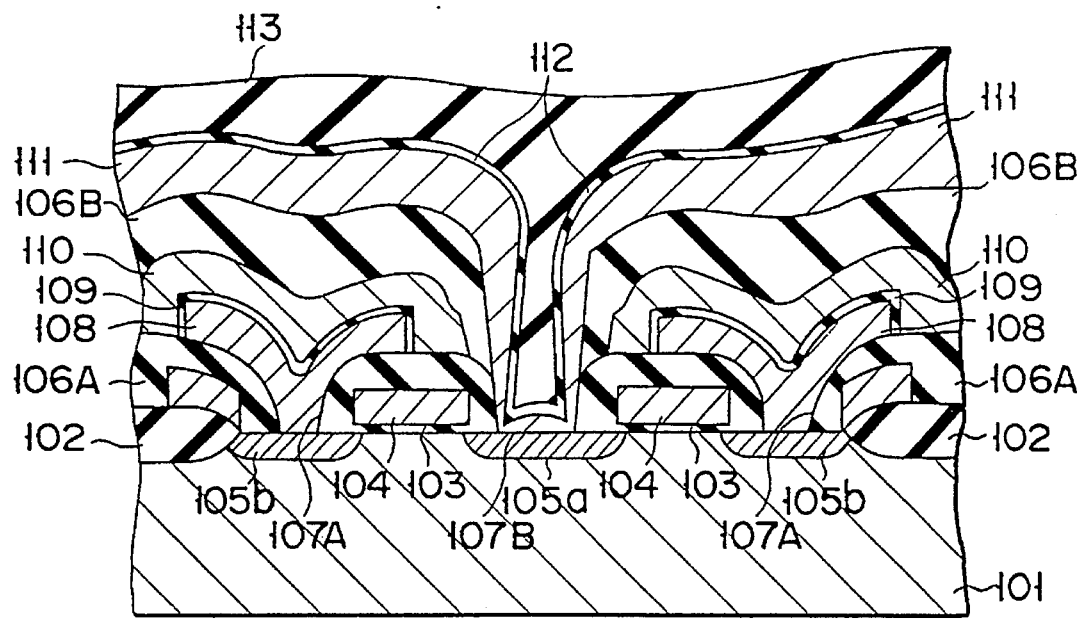
F I G. 7A
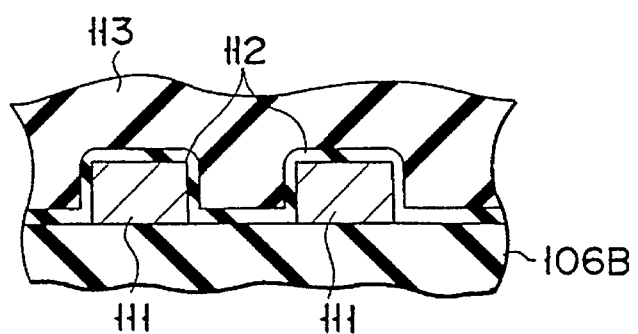
F I G. 7B

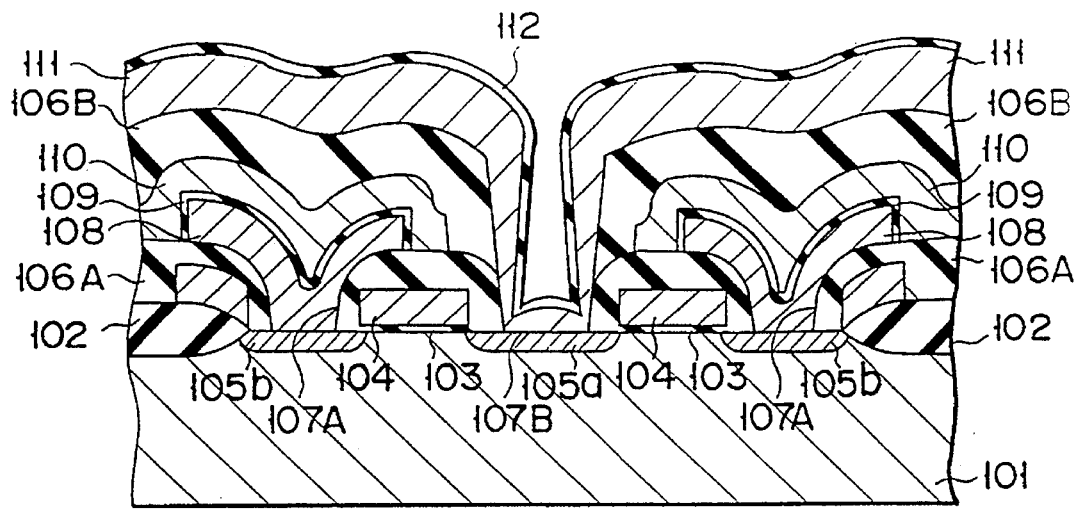
F I G. 8A
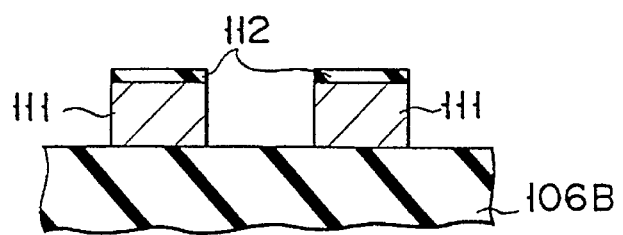
F I G. 8B

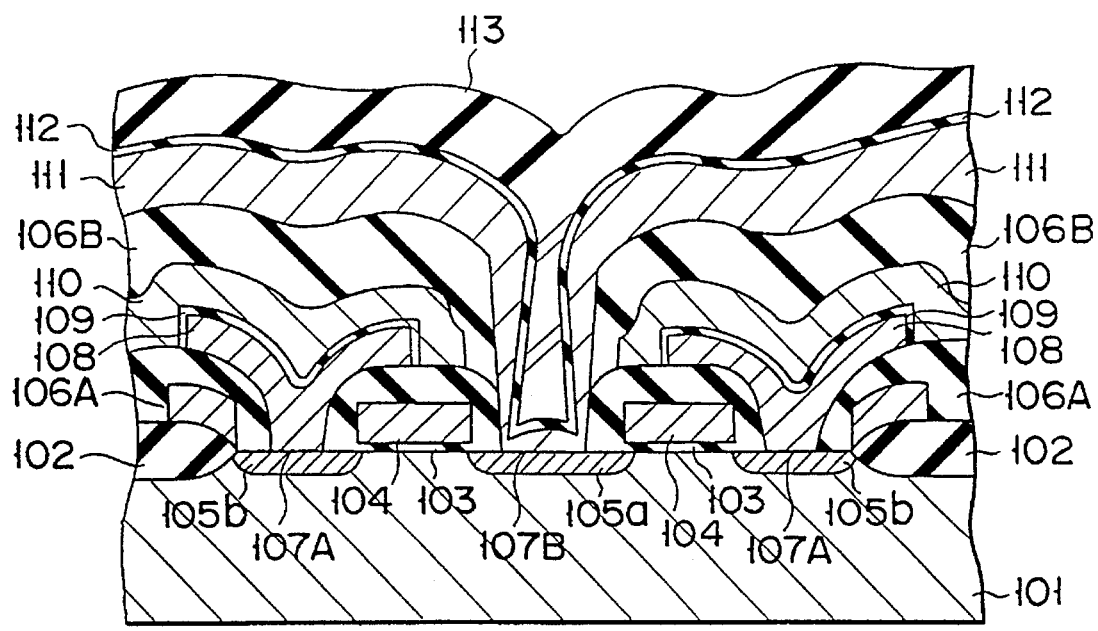
F I G. 9A
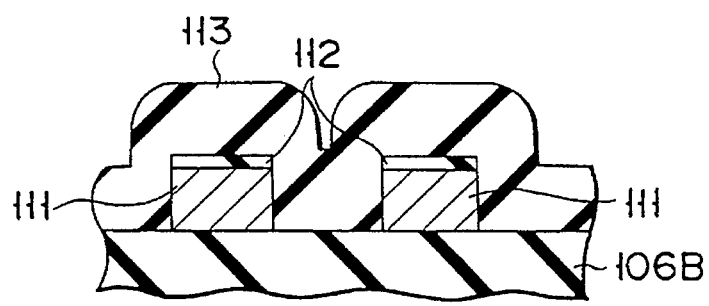
F I G. 9B

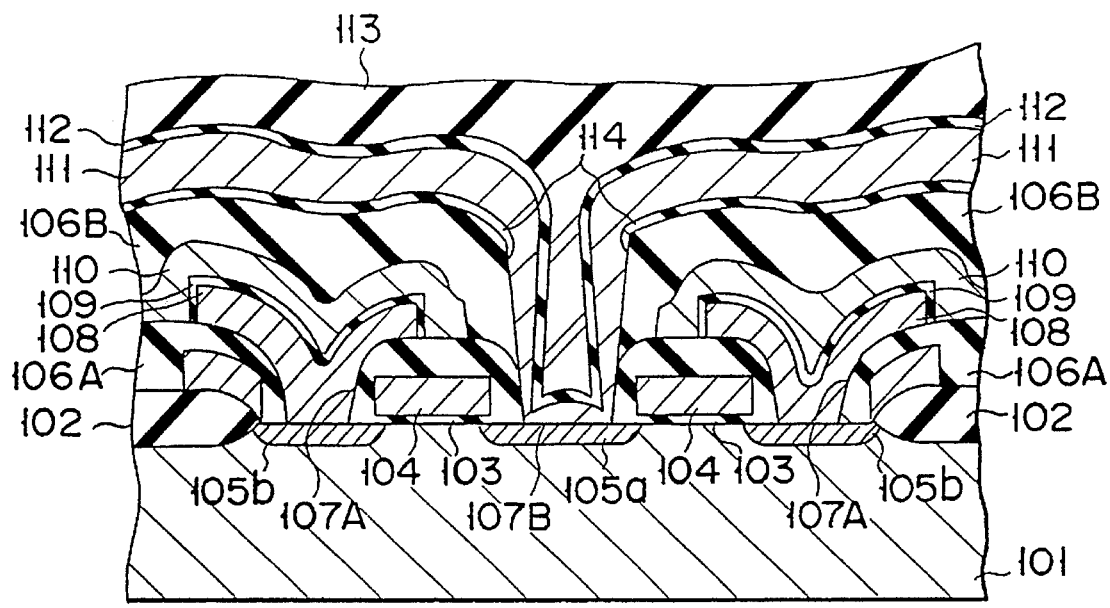
F I G. 10A
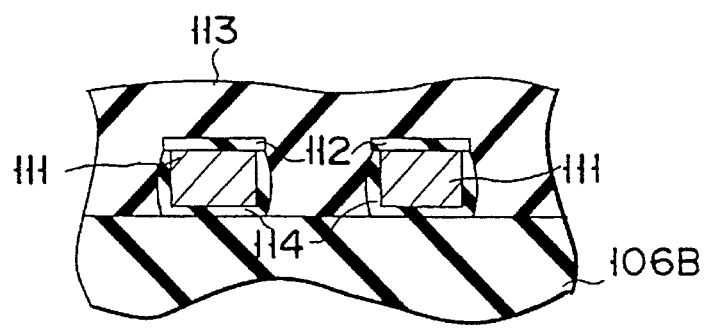
F I G. 10B

SEMICONDUCTOR DEVICE AND A METHOD OF MANUFACTURING SAME

This is a continuation of application Ser. No. 07/878,921 filed on May 6, 1992, now abandoned, which is a CIP of Ser. No. 07/730,695 filed Jul. 16, 1991 now abandoned.

BACKGROUND OF THE INVENTION

1. Field of the Invention

This invention relates to a semiconductor device and a method of manufacturing the same, and more particularly to a high-density LSI with microscopic interconnections.

2. Description of the Related Art

In conventional semiconductor devices, for example, DRAM memory cells with bit lines have the structure as shown in FIGS. 1A through 1C. FIG. 1B is a sectional view taken along line 1B—1B of FIG. 1A, and FIG. 1C is a sectional view taken along line 1C—1C of FIG. 1A. Numeral 701 indicates a p-type semiconductor substrate, 702 an element isolating oxide film, 703 a silicon oxide film, 704 the gate electrode of a MOS FET, 705 an n-type diffused layer, 706A and 706B interlayer insulating films, 707A and 707B contact holes, 708 the bottom electrode of a capacitor, 709 a capacitor insulating film, 710 the top electrode of the capacitor, and 711 a bit line.

On the memory cell, a flattened interlayer insulating film, such as a BPSG film, is generally formed. Formed on the insulating film are metal interconnections (of, for example, aluminum), on which a passivating film is formed to complete the DRAM. Referring to FIGS. 1A through 3B, a manufacturing method of DRAMs will be explained hereinafter, covering all the way to the final products.

As shown in FIG. 1B, the element isolating oxide film 702 is first formed on the p-type semiconductor substrate 701. On an element region of the p-type semi-conductor substrate 701, the silicon oxide film 703, gate electrode 704, and n-type diffused layer 705 are each formed in a known manner to complete the MOS FET. After the interlayer insulating film 706A is formed all over the surface, the contact hole 707A leading to the n-type diffused layer (source) 705 is made. At the contact hole 707A, the bottom electrode 708 of the capacitor, capacitor insulating film 709, and the top electrode 710 of the capacitor are formed to produce a cell capacitor of the DRAM. Over the whole surface, the interlayer insulating film 706B is formed, and then the contact hole 707B reaching the n-type diffused layer (drain) 705 is made. After this, on the interlayer insulating film 706B and contact hole 707B, the bit line 711 is formed by sputtering with silicide such as $MoSi_2$ or $WSi_2$.

Then, as shown in FIG. 2A, over the entire surface, the interlayer insulating film 712 such as silicate glass (BPSG film) containing, for example, boron (B) or phosphorus (P) is formed. The interlayer insulating film 712 has larger steps in the vicinity of the bit line 711 as shown in FIG. 2B.

Next, as shown in FIGS. 3A and 3B, high-temperature heat treatment (annealing) is performed in an oxidizing atmosphere to flatten the surface of the interlayer insulating film 712. At this time, an oxidizer (e.g., oxygen) penetrates the interlayer insulating film 712 and oxidizes the bit line 711 made of a silicide film. As a result, on the surface of the bit line 711, the oxide film 713 is formed. The metal interconnections (made of, for example, Al) 714 are formed on the flattened interlayer insulating film 712. Over the entire surface, the passivating film 715 is formed to complete the DRAM.

With the aforementioned manufacturing method, however, it is known that the bit line 711 formed by sputtering has a poor step coverage, with the thickness of the bit line 711 being thinner on the sidewall of the contact hole 707 than on the top surface. In this state, when heat treatment is carried out in an oxidizing atmosphere, the thinner portions of the bit line 711 on the sidewall of the contact hole 707B are all oxidized, leading to breaks in interconnections and an increase in the resistance. Because of this, neither sufficient yield nor high reliability can be achieved.

As noted above, conventional semiconductor devices have a poor step coverage of interconnections at the contact holes. Because of this, a subsequent heat treatment causes the oxidizer to react upon the interconnections to form an oxide film, which results in breaks and increase in the resistance at the thinner portions of the interconnections in the contact holes.

SUMMARY OF THE INVENTION

Accordingly, the object of the present invention is to provide a semiconductor device and a method of manufacturing the same that achieve a good yield and high reliability by preventing breaks and an increase in the resistance in the contact holes.

The foregoing object is accomplished by a semiconductor device comprising: a first conducting layer; an insulating layer having a contact hole reaching the first conducting layer; a second conducting layer connected through the contact hole to the first conducting layer; and anti-oxidation material covering at least part of the surface of the second conducting layer.

In a manufacturing method of semiconductor devices according to the present invention, a first conducting layer is formed on the surface of the semiconductor substrate and then a first insulating layer is formed above the semiconductor substrate. In the first insulating layer, a contact hole reaching the first conducting layer is made. After a second conducting layer is formed over the whole surface, patterning is performed on the second conducting layer. Anti-oxidation material is covered over the entire surface and then a second insulating layer is formed all over the surface. After this, heat treatment is carried out in an oxidizing atmosphere.

In another manufacturing method of semiconductor devices according to the present invention, a first conducting layer is formed on the surface of the semiconductor substrate and then a first insulating layer is formed above the semiconductor substrate. In the first insulating layer, a contact hole reaching the first conducting layer is made. A second conducting layer is formed over the entire surface, and then anti-oxidation material is covered all over the surface. Patterning is performed on the anti-oxidation material and second conducting layer and then a second insulating layer is formed over the entire surface. After this, heat treatment is carried out in an oxidizing atmosphere.

With such a configuration, at least part of the surface of the second conducting layer is covered with the anti-oxidation material. This prevents breaks in interconnections and an increase in the resistance value, thereby achieving a highly reliable semiconductor with a good yield.

With such a manufacturing method, the thinner portions of the conducting layer in the contact hole are covered with anti-oxidation material. If necessary, part of the surface of the conducting layer outside the contact hole may be covered with anti-oxidation material. This achieves interconnections of lower resistance without causing breaks.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A through 3B are a pattern diagram and sectional views illustrating a manufacturing method of a conventional semiconductor device;

FIGS. 4A through 7B are pattern diagrams and sectional views illustrating the manufacturing processes for a semiconductor device according to a first embodiment of the present invention; and FIGS. 8A through 10B are pattern diagrams and sectional views illustrating the manufacturing processes for a semiconductor device according to a second embodiment of the present invention.

DETAILED DESCRIPTION OF THE PREFERRED

Referring to the accompanying drawings, an embodiment of the present invention will be explained in detail.

Figure 2A:
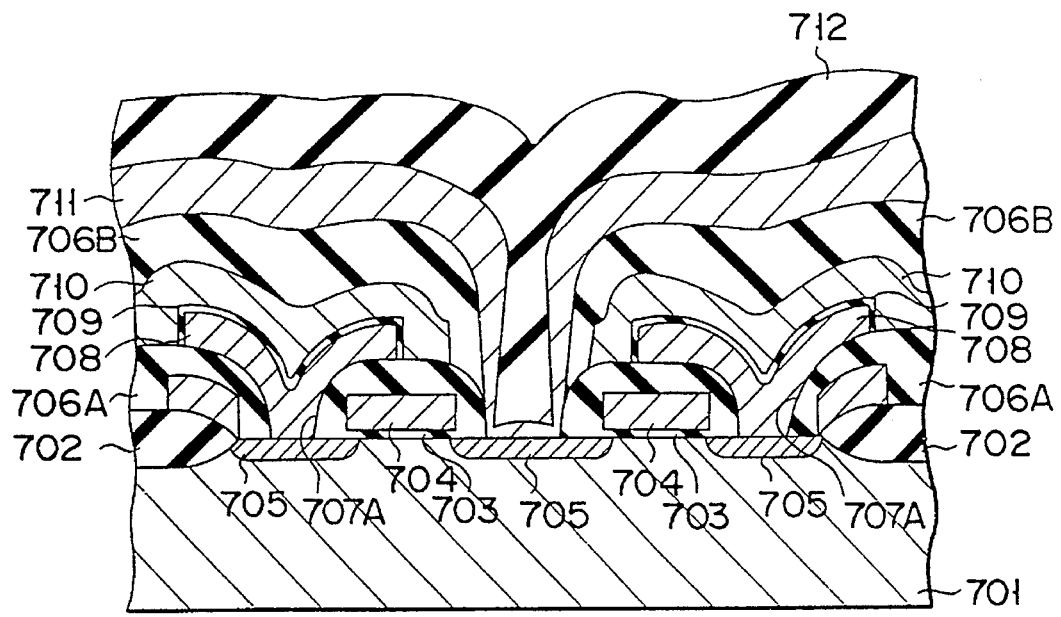
Figure 2B:
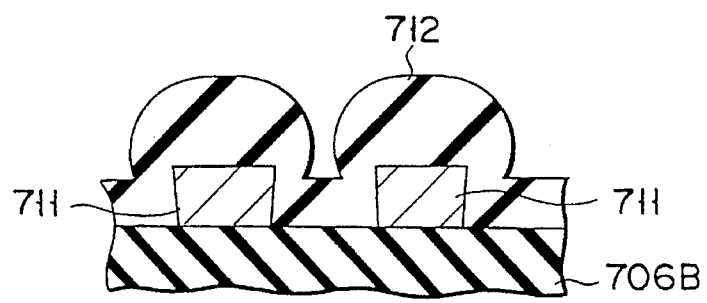
Figure 4A:
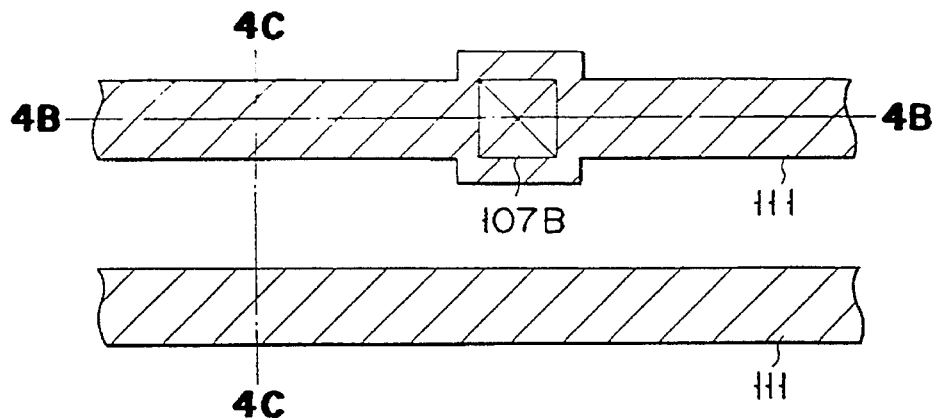
Figure 4B:
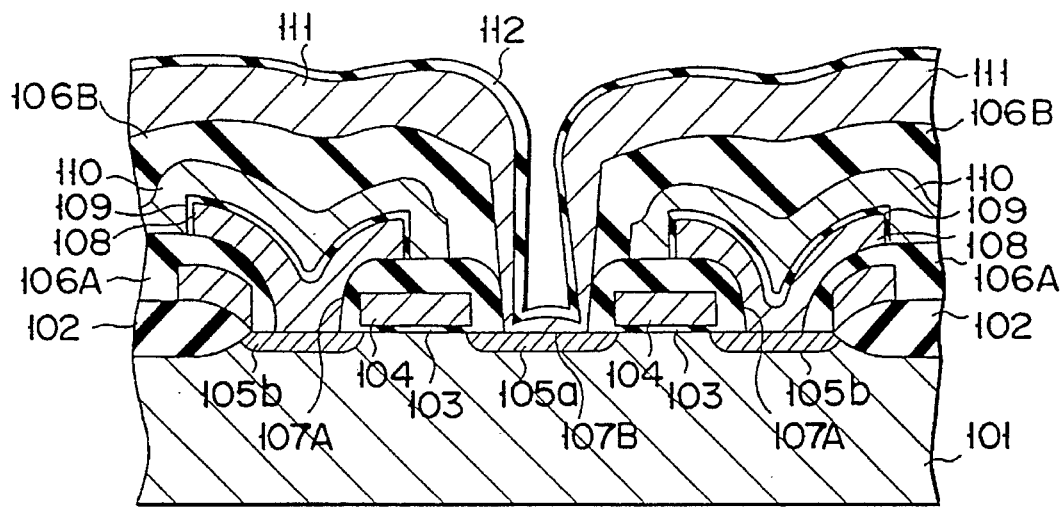
Figure 4C:
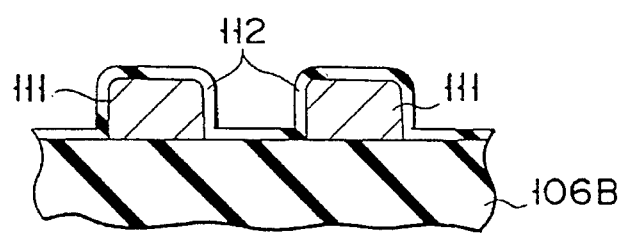

FIGS. 4A through 4C show a semiconductor device according to an embodiment of the present invention. FIG. 4B is a sectional view taken on line 4B—4B of FIG. 4A and FIG. 4C is a sectional view taken on line 4C—4C of FIG. 4A. Numeral 101 indicates a p-type semi-conductor substrate, 102 an element isolating oxide film, 103 an oxide silicon film, 104 the gate electrode of a MOS FET, 105 an n-type diffused layer (a first conducting layer), 106A and 106B interlayer insulating films (insulating layers), 107A and 107B contact holes, 108 the bottom electrode of a capacitor, 109 a capacitor insulating film, 110 the top electrode of the capacitor, and 111 a bit line (a second conducting layer).

Specifically, the element isolating oxide film 102 is formed on the p-type semiconductor substrate 101. On an element region of the p-type semiconductor substrate 101, the silicon oxide film 103 and gate electrode 104 are formed. At the surface of the substrate 101, the n-type diffused layers 105a and 105b are formed. This is the arrangement of the MOS FET. Formed over the entire surface is the interlayer insulating film 106A, in which the contact hole 107A leading to the n-type diffused layer (source) 105b is made. On the interlayer insulating film 106A, the bottom electrode 108 of the capacitor is formed so as to be embedded in the contact hole 107A. On the bottom electrode 108, the capacitor insulating film 109 and the top electrode 110 of the capacitor are formed to produce a cell capacitor of the DRAM. Over the whole surface, the interlayer insulating film 106B is formed, and then the contact hole 107B reaching the n-type diffused layer (drain) 105a is made. On the interlayer insulating film 106B, the bit line 111, which is composed of a silicide film of, for example, $MoSi_2$ or $WSi_2$, is formed so as to be embedded in the contact hole 107B. On the surface of the bit line 111, anti-oxidation material 112 such as SiN is coated.

With this configuration, the surface of the bit line 111 is covered with the anti-oxidation material 112. That is, as seen from FIGS. 4A and 4B, the thinner portions of the bit line 111 on the sidewall of the contact hole 107B are covered with the anti-oxidation material 112, so that the thinner portions will not be affected by the oxidizer during heat treatment. Consequently, breaks and an increase in the resistance value due to oxidation of the bit line 111 in the contact hole 107B can be prevented.

FIGS. 5A through 7B are a pattern plan view and sectional views illustrating the manufacturing processes of a semiconductor device according to an embodiment of the present invention.

Figure 5A:
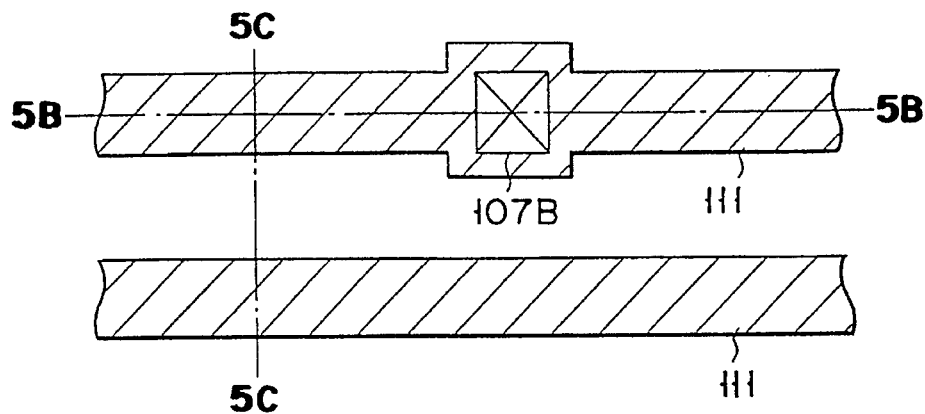
Figure 5B:
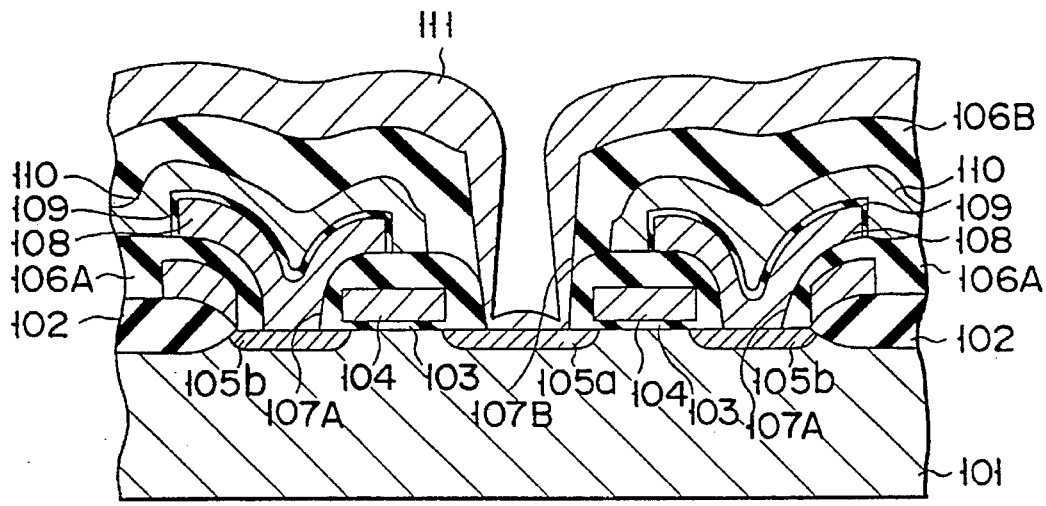
Figure 5C:
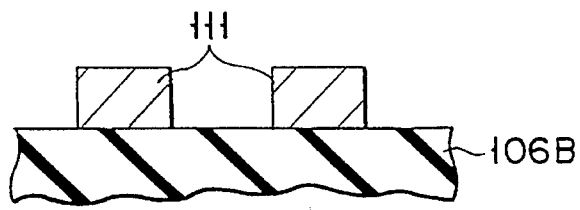

As shown in FIG. 5B, the element isolating oxide film 102 is first formed on the p-type semiconductor substrate 101. On the surface of an element region of the p-type semiconductor substrate 101, the silicon oxide film 103 and gate electrode 104 are formed sequentially. On the surface of the substrate 101, the n-type diffused layers (first conducting layers) 105a and 105b are formed in a known manner to complete the MOS FET. After the interlayer insulating film 106A is formed over the whole surface, the contact hole 107A leading to the n-type diffused layer (source) 105b is made. On the interlayer insulating film 106A, the bottom electrode 108 of a capacitor is formed so as to be embedded in the contact hole 107A. On the bottom electrode 108, the capacitor insulating film 109, and the top electrode 710 of the capacitor are formed in sequence to produce a cell capacitor of the DRAM. Over the whole surface, the interlayer insulating film 106B is formed, and then the contact hole 707B reaching the n-type diffused layer (drain) 105a is made. After this, on the interlayer insulating film 106B and contact hole 107B, the bit line (a second conducting layer) 111 is formed by sputtering with silicide such as $MoSi_2$ or $WSi_2$.

Then, as shown in FIG. 6A, over the entire surface, anti-oxidation material 112 such as an SiN film is coated. On the anti-oxidation material 112, the interlayer insulating film (a second insulating film) 113 such as silicate glass (BPSG film) containing, for example, boron (B) or phosphorus (P), is formed by, for example, LPCVD or CVD techniques. The interlayer insulating film 113 has larger steps at the edges of the bit line or between adjacent bit lines as shown in FIG. 6B.

Next, as shown in FIGS. 7A and 7B, high-temperature heat treatment (annealing) is performed for 10 minutes at a temperature of 900° C. in an oxidizing atmosphere (e.g., wet oxidation containing $H_2O$) to flatten the surface of the interlayer insulating film 113. At this time, although an oxidizer (e.g., oxygen) penetrates the interlayer insulating film 113, the bit line 111 on the sidewall of the contact hole 107B will not be oxidized because the surface of the bit line 111 is covered with the anti-oxidation material 112. After this, although not shown, on the interlayer insulating film 113, the metal interconnections (made of, for example, Al) are formed. Over the entire surface, the passivating film is formed to complete the DRAM.

In this method, the thinner portions of the bit line 111 in the contact hole 107B are also covered with the anti-oxidation material, which prevents the portions from being oxidized during a subsequent heat treatment. As a result, breaks in the bit line 111 and an increase in the resistance value can be avoided.

With the above embodiment, it is known that use of a MoSi$_2$ film for the bit line 111 can decrease its sheet resistance by oxidation. Thus, when the bit line 111 is desired to be purposely oxidized without causing breaks or increasing the resistance, this can be met by the method described below.

FIGS. 8A through 10B illustrate a manufacturing method of a semiconductor device according to another embodiment of the present invention. The same parts in this and the above-described embodiments are indicated by the same reference characters.

As shown in FIGS. 8A and 8B, the element isolating oxide film 102 is first formed on the p-type semiconductor substrate 101. On the p-type semiconductor substrate 101, the silicon oxide film 103 and gate electrode 104 are also formed. At the surface of the semiconductor substrate 101, the n-type diffused layers (a first conducting layer) 105a and 105b are then formed to complete the MOS FET. Over the entire surface, the interlayer insulating film 106A is formed which has the contact hole 107A in it. After this, a DRAM cell capacitor is formed which composed of the bottom electrode 108, the capacitor insulating film 109, and the top electrode 110. Over the whole surface, the interlayer insulating film 106B is formed which has the contact hole 107B in it. Then, over the whole surface, a silicide film made of, for example, MoSi$_2$ or WSi$_2$ is formed. On the silicide film, the anti-oxidation film 112 such as an SiN film is formed. After this, the bit line (a second conducting layer) 111 is formed by patterning of a stacked layer of the anti-oxidation material 112 and silicide film, with the anti-oxidation material 112 present only on the top surface of the bit line 111 and absent on its sides.

Then, as shown in FIGS. 9A and 9B, over the entire surface, the interlayer insulating film (a second insulating film) 113 such as silicate glass (BPSG film) containing, for example, boron (B) or phosphorus (P), is formed by, for example, LPCVD or CVD techniques. The interlayer insulating film 113 has larger steps at the edges of the bit line 111 or between adjacent bit lines as shown in FIG. 9B.

Next, as shown in FIGS. 10A and 10B, high-temperature heat treatment (annealing) is performed for 10 minutes at a temperature of 900° C. in an oxidizing atmosphere (e.g., wet oxidation containing H$_2$O) to flatten the surface of the interlayer insulating film 113. At this time, since an oxidizer (e.g., oxygen) penetrates the interlayer insulating film 113, the bit line 111 will be oxidized on its side and bottom surfaces except for the top surface covered with the anti-oxidation material 112, thereby forming the oxide film 114. On the other hand, since the portions of the bit line 111 on the sidewall of the contact hole 107B are covered with the anti-oxidation material 112, they will not be oxidized. After this, although not shown, on the interlayer insulating film 113, the metal interconnections (made of, for example, Al) are formed. Over the entire surface, the passivating film is formed to complete the DRAM.

In this method, only the top surface of the bit line 111 is covered with the anti-oxidation material 112. Thus, it is possible to purposely oxidize the side and bottom surfaces to such an extent as not to cause breaks in order to decrease the resistance value of the bit line 111. Since the oxidizer does not reach the bottom of the contact hole 107B, the thinner portions of the bit line 111 on the side wall of the hole 107B are not be oxidized, thereby preventing breaks and an increase in the resistance value.

In the above embodiments, the bit line 111 may be made up of a stacked structure of a polysilicon film and a silicide film. The contact hole 107B is not restricted to one reaching the substrate 101 and may be other modifications.

While in the above embodiments, the present invention is applied to a DRAM semiconductor memory device, it is not limited to this and may be applicable to all types of high-density LSIs with microscopic semiconductor elements.

As described above, with the semiconductor device according to this invention and the manufacturing method thereof, at least part of the surface of the conducting layer undergone patterning is covered with anti-oxidation material. This prevents breaks and an increase in the resistance in the contact hole, thereby achieving a highly reliable semiconductor device with a good yield.

Additional advantages and modifications will readily occur to those skilled in the art. Therefore, the invention in its broader aspects is not limited to the specific details, and representative devices, and illustrated examples shown and described herein. Accordingly, various modifications may be made without departing from the spirit or scope of the general inventive concept as defined by the appended claims and their equivalents.

I claim:

1. A semiconductor device comprising:

a semiconductor substrate;

a first conducting layer formed on the surface of said semiconductor substrate;

a first insulating layer formed above said semiconductor substrate, the insulating layer having a contact hole reaching said first conducting layer to expose it;

a second conducting layer formed on said first insulating layer, the sidewall of said contact hole, and said first conducting layer;

an anti-oxidation layer formed on at least part of the surface of said second conducting layer; and a second insulating layer formed on the entire surface of said anti-oxidation layer so as to fill said contact hole, wherein said second conducting layer is formed using a sputtering method so that a portion of said second conducting layer on said sidewall of said contact hole is thinner than portions thereof on said first insulating layer and on said first conducting layer, and wherein said second insulating layer is flattened through heat treatment in an oxidizing atmosphere.

2. A semiconductor device according to claim 1, wherein said anti-oxidation layer is formed only on the top surface of said second conducting layer.

3. A semiconductor device according to claim 1, wherein said anti-oxidation layer is formed only on the top and side surfaces of said second conducting layer.

4. A semiconductor device according to claim 1, wherein said anti-oxidation layer is a silicon nitride layer.

5. A semiconductor device according to claim 1, wherein said second conducting layer contains a silicide layer.

6. A manufacturing method of a semiconductor device, comprising the steps of:

forming a first conducting layer on the surface of a semiconductor substrate;

forming a first insulating layer on said semiconductor substrate;

forming a contact hole in said first insulating layer, the contact hole reaching said first conducting layer;

forming a second conducting layer on said first insulating layer, on the sidewall of said contact hole and on said first conducting layer, using a sputtering method;

patterning said second conducting layer;

forming an anti-oxidation layer over the entire surface;

forming a second insulating layer over the entire surface so as to fill said contact hole; and flattening said second insulating layer through heat treatment in an oxidizing atmosphere.

7. A manufacturing method of a semiconductor device, comprising the steps of:

forming a first conducting layer on the surface of a semiconductor substrate;

forming a first insulating layer on said semiconductor substrate;

forming a contact hole in said first insulating layer, the contact hole reaching said first conducting layer;

forming a second conducting layer over the entire surface of said first insulating layer, using a sputtering method;

forming an anti-oxidation layer over the entire surface;

patterning said anti-oxidation layer and said second conducting layer;

forming a second insulating layer over the entire surface so as to fill said contact hole; and flattening said second insulating layer through heat treatment in an oxidizing atmosphere, wherein said second conducting layer is oxidized on side and bottom surfaces of said second conducting layer during said heat treatment of said second insulating layer.

8. A manufacturing method of a semiconductor memory device, comprising the steps of:

forming element isolating oxide layers on the surface of a semiconductor substrate;

forming first, second and third diffused regions on the surface of a semiconductor substrate at predetermined intervals, said first and third diffused regions serving as a source/drain region and said second diffused region serving as a common drain/source region of first and second memory transistors, respectively;

forming first and second gate electrodes of said first and second memory transistors;

forming a first interlayer insulating layer on said first and second gate electrodes and on said element isolating oxide layers;

forming first and second contact holes, said first contact hole reaching said first diffused region and the second contact hole reaching said third diffused region;

forming first and second bottom electrodes of first and second capacitors constituting said first and second memory transistors on said first interlayer insulating layer, having contact with said first and second diffused regions, respectively;

forming first and second capacitor insulating films of said first and second capacitors on said first and second bottom electrodes;

forming first and second top electrodes of first and second capacitors on said first and second capacitor insulating films;

forming a second interlayer insulating layer on the entire surface of the resultant structure;

forming a third contact hole, the third contact hole reaching said second diffused region;

forming a conducting layer on said second interlayer insulating layer and said second diffused layer;

patterning said conducting layer;

forming an anti-oxidation layer over the entire surface;

forming an insulating layer over the entire surface; and flattening said insulating layer through heat treatment in an oxidizing atmosphere.

9. A manufacturing method of a semiconductor memory device, comprising the steps of:

forming element isolating oxide layers on the surface of a semiconductor substrate;

forming first, second and third diffused regions on the surface of a semiconductor substrate at predetermined intervals, said first and third diffused regions serving as a source/drain region and said second diffused region serving as a common drain/source region of first and second memory transistors, respectively;

forming first and second gate electrodes of said first and second memory transistors;

forming a first interlayer insulating layer on said first and second gate electrodes and said element isolating oxide layers;

forming first and second contact holes, said first contact hole reaching said first diffused region and the second contact hole reaching said third diffused region;

forming first and second bottom electrodes of first and second capacitors constituting said first and second memory transistors on said first interlayer insulating layer, having contact with said first and second diffused region, respectively;

forming first and second capacitor insulating films of said first and second capacitors on said first and second bottom electrodes;

forming first and second top electrodes of first and second capacitors on said first and second capacitor insulating films;

forming a second interlayer insulating layer on the entire surface of the resultant structure;

forming a third contact hole, the third contact hole reaching said second diffused region;

forming a conducting layer on said second interlayer insulating layer and said second diffused layer;

forming an anti-oxidation layer over the entire surface;

patterning said conducting layer and said anti-oxidation layer;

forming an insulating layer over the entire surface; and flattening said insulating layer through heat treatment in an oxidizing atmosphere.

10. A memory device, comprising:

first and second memory cells including first and second memory transistors and first and second capacitors, which are formed on the surface of a semiconductor substrate;

said first memory transistor comprising;
first and second diffused regions on the surface of said semiconductor substrate at predetermined intervals, said first diffused regions serving as a source/drain region of said first memory transistor and said second diffused region serving as a common drain/source region between said first and second memory transistors;
a first gate electrode; and
a first interlayer insulating layer formed on said first gate electrode;

said first capacitor comprising;
a first contact hole, said first contact hole reaching said first diffused region;

a first bottom electrode formed on said first interlayer insulating layer, having contact with said diffused region;

a first capacitor insulating film formed on said first bottom electrode; and a first top electrode formed on said first capacitor insulating film;

said second memory transistor comprising;

third diffused region on the surface of said semiconductor substrate separated from said second diffused region at predetermined intervals, said third diffused region serving as a source/drain region of said second memory transistor;

a second gate electrode; and a second interlayer insulating layer formed on said second gate electrode;

said second capacitor comprising;

a second contact hole, said second contact hole reaching said third diffused region;

a second bottom electrode formed on said second interlayer insulating layer, having contact with said third diffused region;

a second capacitor insulating films formed on said second bottom electrode; and a second top electrode formed on said second capacitor insulating film;

said memory device being characterized by further comprising;

a third interlayer insulating layer formed on said first and second memory transistors, said third interlayer insulating layer having a third contact hole which reaches said second diffused region;

a conducting layer formed on said third interlayer insulating layer, the side wall of said third contact hole and said second diffused region, said conducting layer serving as a bit line of said memory device;

an anti-oxidation layer formed on at least part of the surface of said conducting layer; and a fourth interlayer insulating layer formed on said anti-oxidation layer, flattened through heat treatment in an oxidizing atmosphere.

11. A memory device according to claim 10, wherein said anti-oxidation layer is formed only on the top surface of said conducting layer.

12. A memory device according to claim 10, wherein said anti-oxidation layer is formed only on the top and the side surfaces of said conducting layer.

13. A memory device according to claim 10, wherein said anti-oxidation layer is a silicon nitride layer.

14. A memory device according to claim 10, wherein said conducting layer contains a silicide layer.

* * * * *